United States Patent
Marinov Peev et al.

(10) Patent No.: US 11,163,020 B2
(45) Date of Patent: Nov. 2, 2021

(54) SENSOR CIRCUIT WITH OFFSET COMPENSATION

(71) Applicant: Melexis Bulgaria Ltd, Sofia (BG)

(72) Inventors: Rumen Marinov Peev, Sofia (BG); Stoyan Georgiev Gaydov, Sofia (BG)

(73) Assignee: MELEXIS BULGARIA LTD, Sofia (BE)

(*) Notice: Subject to any disclaimer, the term of this patent is extended or adjusted under 35 U.S.C. 154(b) by 59 days.

(21) Appl. No.: 16/659,753

(22) Filed: Oct. 22, 2019

(65) Prior Publication Data
US 2020/0124685 A1 Apr. 23, 2020

(30) Foreign Application Priority Data
Oct. 23, 2018 (EP) .................... 18202090.9

(51) Int. Cl.
*G01R 33/00* (2006.01)
*G01R 33/07* (2006.01)
*G01L 19/00* (2006.01)
*G01K 1/00* (2006.01)

(52) U.S. Cl.
CPC ....... *G01R 33/0082* (2013.01); *G01R 33/075* (2013.01); *G01K 1/00* (2013.01); *G01L 19/00* (2013.01)

(58) Field of Classification Search
CPC ............. G01R 33/0082; G01R 33/075; G01R 33/0029; G01R 33/07; G01K 1/00; G01L 19/00; G01D 3/036
USPC ......................................................... 324/225
See application file for complete search history.

(56) References Cited

U.S. PATENT DOCUMENTS

| | | | |
|---|---|---|---|
| 2,906,945 A * | 9/1959 | Weiss | G01R 33/07 324/251 |
| 7,302,357 B2 | 11/2007 | Ausserlechner et al. | |
| 2009/0030641 A1 | 1/2009 | Fjield et al. | |
| 2014/0009221 A1 | 1/2014 | Motz et al. | |
| 2014/0055146 A1 | 2/2014 | Herzer et al. | |
| 2014/0369380 A1 | 12/2014 | Ausserlechner | |
| 2015/0070002 A1* | 3/2015 | Schott | G01D 5/145 324/207.2 |

(Continued)

FOREIGN PATENT DOCUMENTS

| | | |
|---|---|---|
| EP | 2733466 A1 | 5/2014 |
| EP | 3062076 A1 | 8/2016 |
| EP | 3101440 A1 | 12/2016 |

OTHER PUBLICATIONS

European Search Report from EP Application No. 18202090.9, dated May 27, 2019.

(Continued)

*Primary Examiner* — Christopher P McAndrew
(74) *Attorney, Agent, or Firm* — Workman Nydegger

(57) ABSTRACT

A sensor circuit comprises a sensor adapted to sense a physical quantity and to produce a sensor output signal. A sensor-offset correction block is arranged to receive a signal indicative of a supply voltage applied to the sensor circuit and to generate a compensation signal based on the signal indicative of the supply voltage and on a quantity indicative of a state of the sensor circuit. A combiner is adapted to combine the sensor output signal with the compensation signal, thereby obtaining a compensated signal.

16 Claims, 1 Drawing Sheet

(56) References Cited

U.S. PATENT DOCUMENTS

2016/0131722 A1* 5/2016 Ausserlechner ... G01R 33/0082
            324/225
2017/0248662 A1* 8/2017 Santos ............... G01R 33/0029
2017/0345997 A1* 11/2017 Ausserlechner ........ H01L 43/04
2020/0119667 A1* 4/2020 Goossens ................ H02P 6/157

OTHER PUBLICATIONS

Office Action from corresponding European Application No. EP18202090.9, dated Jun. 4, 2021.

* cited by examiner

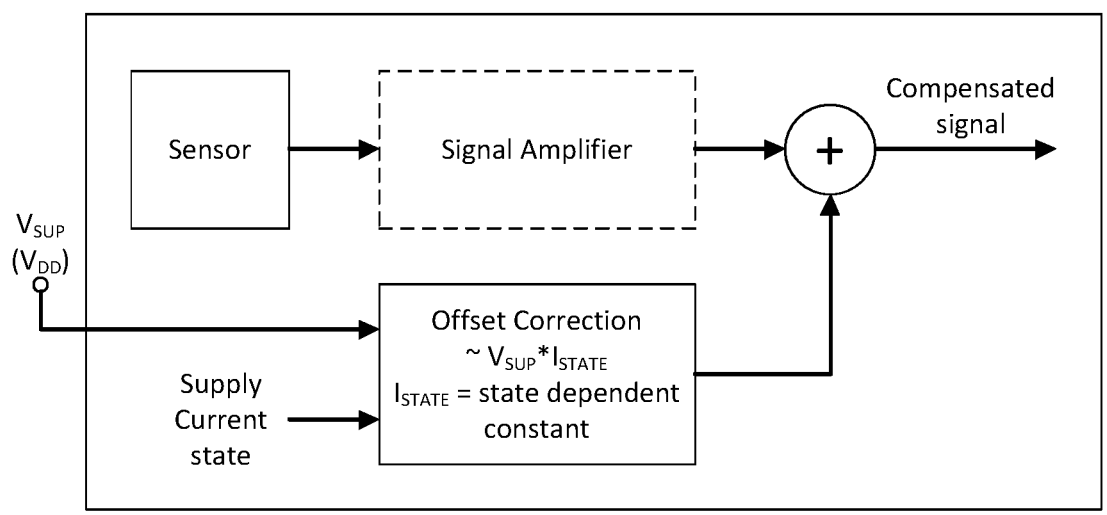

SENSOR CIRCUIT WITH OFFSET COMPENSATION

FIELD OF THE INVENTION

The present invention is generally related to the field of sensors arranged for sensing some physical quantity.

BACKGROUND OF THE INVENTION

Sensors can be affected by many different internal and external characteristics that can make the sensor output signals less accurate. In various physical quantity sensors temperature gradient dependent offset is observed. Often such sensors are integrated in an integrated circuit. This offset could be significant, especially with substantial on-chip power dissipation (for example in a two-wire sensor) and/or in magnetic sensors with IMC (Integrated Magnetic Concentrator). If such offset worsens the sensor accuracy, the application area of the sensor may become limited.

Temperature gradient dependent offset compensation has been widely described in the prior art, both in scientific and in patent literature. One possible approach involves the use of an additional sensor element arranged thermally proximate the main sensor element on the substrate and configured to sense a spatial gradient of temperature. The signal from this additional sensor can be amplified and used to compensate the temperature gradient dependent offset of the main sensor. An example is found in US2014/369380, where compensation is proposed for thermal EMF effects that can cause residual offset and other errors in sensor systems.

Thermal electromagnetic force (EMF) is one of the possible causes of temperature gradient dependent offset. Thermal EMF relates to the effect temperature can have on the movement of electric charge in a material. A temperature gradient in a material, for example, can affect charge flow in the material much like an applied electric field, by pushing charges in a particular direction. This can be amplified in the presence of electric or magnetic fields, or concentration gradients. Thermal EMF also can cause temperature-related charges in two primary situations: first, an inhomogeneous temperature (i.e., a temperature gradient) in a homogeneous material, or vice versa a homogeneous temperature in an inhomogeneous material. The second may, for example, occur at device contacts, with the voltage referred to as a thermal contact voltage. Both are undesirable with respect to sensor operation and output signal accuracy.

Another possible cause of temperature gradient dependent offset is the Seebeck effect. The Seebeck effect is the conversion of heat directly into electricity at the junction of different types of wire.

The compensation for thermal EMF effects presented in the already mentioned application US2014/369380 is in certain embodiments achieved by providing in a sensor system at least one temperature sensor arranged proximate a primary sensor element (e.g., a Hall plate in case the sensor system comprises a Hall-effect magnetic field sensing system). In other embodiments a plurality of temperature sensors can be used, each arranged proximate a different sensor contact or element. If the Hall plate is operated according to a spinning operation scheme, the at least one temperature sensor can be configured to sense a temperature in each operating phase. The individual sensed temperatures can be combined and used to provide a temperature-dependent compensation signal.

Hence, there is a need for a sensor circuit wherein the use of additional sensors is avoided.

SUMMARY OF THE INVENTION

It is an object of embodiments of the present invention to provide for a sensor circuit capable of dealing with temperature dependent gradient offset without additional sensors.

The above objective is accomplished by the solution according to the present invention.

In a first aspect the invention relates to a sensor circuit comprising
- a sensor adapted to sense a physical quantity and to produce a sensor output signal,
- a sensor-offset correction block arranged to receive a signal indicative of a supply voltage applied to the sensor circuit and to generate a compensation signal based on the signal indicative of the supply voltage and on a quantity indicative of a state of the sensor circuit,
- a combiner adapted to combine the sensor output signal with the compensation signal, thereby obtaining a compensated signal.

The proposed solution is indeed suitable for an offset compensation. The correction block is arranged for determining a compensation signal based on the signal indicative of the supply voltage applied to the sensor circuit and on a quantity indicative of a state of the sensor circuit.

In a preferred embodiment the compensation signal is proportional to the supply voltage and/or to said quantity indicative of the state. The proportionality factor is then typically dependent on said quantity indicative of the state.

Advantageously the sensor circuit is arranged for determining via the sensed physical quantity or via the sensor output signal which state of the sensor circuit is active.

In certain embodiments the sensor is a bridge sensor or a magnetic sensor or a Hall sensor. The Hall sensor may comprise an integrated magnetic concentrator. Optionally the Hall sensor is a Hall sensor with spinning current.

In preferred embodiments the sensor circuit comprises an amplifier for amplifying the sensor output signal before applying the sensor output signal to the combiner. The amplifier is in certain embodiments chopped amplifier and/or a differential amplifier and/or an instrumentation amplifier.

The supply current is in some embodiments switchable between a plurality of predetermined values.

In advantageous embodiments the sensor circuit is implemented as a two-wire sensor circuit. In other embodiments it is implemented as a three-wire sensor circuit.

In preferred embodiments the physical quantity is a magnetic field, a pressure or a temperature.

In another embodiment the sensor circuit is arranged for determining the state based on the compensated signal.

The invention also relates to an integrated circuit comprising a sensor circuit as previously described.

In a preferred embodiment the compensation signal is a function of power dissipation in the integrated circuit and/or said supply voltage and/or temperature of the integrated circuit and/or output voltage and/or output current of the integrated circuit.

In one embodiment the state is representative of power dissipation in the integrated circuit.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

FIG. 1 illustrates a block scheme of an embodiment of the sensor circuit according to the invention.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, FIGURE, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention presents a sensor circuit that does not require additional sensors to compensate for temperature dependent gradient offset.

FIG. 1 describes a general view on the sensor circuit (1) according to the invention. The sensor circuit is typically part of an integrated circuit. The circuit comprises a sensor (3) that senses a physical quantity, like e.g. a magnetic field, a temperature or a pressure. The sensor may be a Hall sensor or some other magnetic sensor, a pressure sensor or any other physical quantity sensor.

An important component of the sensor circuit according to the invention is the sensor offset compensation block (5), which has at least two inputs and produces a compensation signal as output. In order to compensate for temperature gradient dependent offset in the integrated circuit it is, generally stated, required to calculate a quantity related to the power dissipation in the integrated circuit that the sensor circuit forms a part of. To achieve that several options are available. A straightforward way is to determine the power dissipation by measuring the supply voltage and the supply current. Many equivalent approaches can however be envisaged. For example, in case of a three-wire sensor circuit the supply current is assumed constant independently of the sensor output stage. Therefore, the dissipated power can be determined from the supply voltage by multiplication with a constant representative of the supply current.

In case of a two-wire sensor circuit, the output current has two components, namely a current required for operating the integrated circuit (2-3 mA) and a state dependent current generated in a dedicated current source. The current source changes the outputted current depending on the sensor state. The supply current is thus a function of the sensor state. The dissipated power can be therefore calculated by determining the supply voltage and an indication of the sensor circuit state.

In certain embodiments the analog value of the supply current, e.g. resulting from a measurement, is used in the offset correction block. In order to simplify the circuit design, however, an equivalent measurement such as a determination of the supply current state can be used. Such equivalent measurement can already be digital (quantized). The equivalent quantized signal can take a value from a set of possible values, e.g. two or three or more values. For example, there can be an on/off state with corresponding current values I_on and I_off which are well known since they are generated and regulated by the integrated circuit. In yet other embodiments the supply current is a function of both the sensor state and of the supply voltage and the coefficient K_on for example is no longer a constant but a function of the supply voltage Vdd.

In the compensation block (5) a compensation signal is determined. In some embodiments the compensation block can calculate the compensation signal simply by dividing the supply voltage by a fixed coefficient for each state, e.g. VDD/K_on and VDD/K_off, whereby K_on and K_off are determined during calibration. In some other embodiments K_on and K_off are not constant but a function of the temperature and/or the supply voltage (e.g. K_on(VDD, temp . . . )).

In other embodiments the compensation signal does not depend on discrete values, but is a function of the supply voltage, temperature, supply current and/or state and/or output current. In case the compensation signal is represented by one of a set of discrete values, at least one value should be provided to the offset compensation block, but more than one can be provided, depending on the state of the input current and/or temperature.

Optionally the sensor output signal is first fed to a signal amplifier. In various embodiments this amplifier may be a chopped amplifier, a differential amplifier and/or an instrumentation amplifier.

The combiner (7) is a summing block. In certain embodiments it adds the sensor output signal and the compensation signal in the analog domain. In other embodiments it also can be done digitally provided there is an ADC between the sensor and the combiner. In case of spinning the two or four phases are averaged out (standard hall plate spinning) and the output of this two or four phase spinning is then inputted to the combiner to compensate for the residual offset. Such a residual offset comes from an asymmetry in the Hall sensor.

The state of the sensor circuit is in embodiments of the invention derived from the signal obtained after compensation. The most common way to determine the state is by use of a comparator to compare the combiner block output with a reference value. For example, in a two-wire sensor circuit the comparator compares the offset corrected sensor output signal to a threshold and from this comparison the state is determined. Depending on the state, a supply current is outputted and so the power can be determined as explained above. In certain embodiments multi state current values can be foreseen. In case of a three wire sensor circuit, where the supply current is assumed independent of the sensor circuit state, the input to the offset correction block is for example a constant (independently of the state) or a more complex, possibly non-linear, function taking into account for example the output state, the output voltage drop, etc. It may be polynomial (for example quadratic), exponential or any other non-linear function. Alternatively, status information can be derived by comparing the combiner output to a multitude of reference values like in omnipolar sensors. In other embodiments the combiner output is digitized and compared to a reference value or values in the digital part.

Although process variation contributes to the residual offset, these contributions are present at all temperatures and therefore can be considered also for compensation, not having any more V/k but V/k+b, where b is a constant representing the offset. It is clear that "b" can have a temperature dependence and in such cases b(t). As in this invention a temperature sensor is not required, the gradient induced offset is determined by the power consumption in contrast with prior art solutions where it is technically measured in the plates. Due to the lack of temperature sensors b(t) will be harder to implement. At high temperature gradients (operation) gradients can be up to 0.5 degree/mm or at least 1 degree/mm. For such gradients, residual offsets are typically of the order of 1 µv or 10-50 µV. The residual offset is independents of the measured B field.

When computing the power dissipation in the integrated circuit, the compensation is clearly linear vs the input voltage. Unfortunately, the residual offset is not driven directly by the power dissipation but rather by the temperature gradient. This temperature gradient has non-linear effects coming from the die design, heat exchange dissipation with the plastic and run-away effects. Such effects make therefore the k factors not constant over V but rather a function of V in some embodiments. In a simple embodiment the k factors are constant for all V values and there are only two k values for the different states. Such compensation can be non-linear (most of the times if implemented) because of the observed non-linear effects.

In practice measurements during final test before installation of the circuit (i.e. at the end of the calibration phase) are performed for each state (in a three wires embodiment for at least one state) to measure and correct the residual offset. Such values are stored in registers (analog or digital) or look-up tables. In the case a higher granularity correction is needed for example as a function of the input voltage, an extrapolation from the measured residual offset can be done based on a predefined value or several residual offset points at different input voltages, for example at maximum and minimum input voltage specs (from 3V to 24V).

The offset compensated signal is further used in the IC for different purposes which may include further processing of this signal. The corrected signal can be used internally in the chip either for a main function like output stage, signal generation etc or for a secondary function like functional safety, signal path verifications . . . .

This is not limited to Hall sensors but any sensor having any temperature-gradient depending offset. In general, the compensation signal could be voltage, current or digital signal. It can be applied directly on the (Hall) sensor, at the signal amplifier (if present), at the signal comparator (if such comparator is present) or digitally compensated (if ADC is present).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A sensor circuit comprising:
   a sensor adapted to sense a physical quantity and to produce a sensor output signal,
   a sensor-offset correction block arranged to receive a signal indicative of a supply voltage applied to said sensor circuit and to generate a compensation signal based on said signal indicative of said supply voltage and on a quantity indicative of a state of said sensor circuit,
   a combiner adapted to combine said sensor output signal with said compensation signal, thereby obtaining a compensated signal.

2. The sensor circuit as in claim 1, wherein said compensation signal is proportional to said supply voltage and/or to said quantity indicative of said state.

3. The sensor circuit as in claim 2, wherein the proportionality factor is dependent on said quantity indicative of said state.

4. The sensor circuit as in claim 1, arranged for determining via said sensed physical quantity or via said sensor output signal which state of said sensor circuit is active.

5. The sensor circuit as in claim 1, wherein said sensor is a bridge sensor or a magnetic sensor or a Hall sensor.

6. The sensor circuit as in claim 5, wherein said Hall sensor comprises an integrated magnetic concentrator.

7. The sensor circuit as in claim 5, wherein said Hall sensor is a Hall sensor with spinning current.

8. The sensor circuit as in claim 1, comprising an amplifier for amplifying said sensor output signal before applying said sensor output signal to said combiner.

9. The sensor circuit as in claim 1, wherein a supply current is switchable between a plurality of predetermined values.

10. The sensor circuit as in claim 1, implemented as a two-wire sensor circuit.

11. The sensor circuit as in claim 1, wherein said physical quantity is a magnetic field, a pressure or a temperature.

12. The sensor circuit as in claim 1 arranged for determining said state based on said compensated signal.

13. An integrated circuit comprising a sensor circuit as in claim 1.

14. The integrated circuit according to claim 13, wherein said compensation signal is a function of power dissipation in said integrated circuit and/or said supply voltage and/or temperature of said integrated circuit and/or output voltage and/or output current of said integrated circuit.

15. The integrated circuit as in claim 13, wherein said state is representative of power dissipation in said integrated circuit.

16. A sensor circuit comprising:
    a sensor adapted to sense a physical quantity and to produce a sensor output signal;
    a sensor-offset correction block arranged to receive a signal indicative of a supply voltage applied to said sensor circuit and to generate a compensation signal based on said signal indicative of said supply voltage and on a quantity indicative of a state of said sensor circuit, whereby said signal indicative of said supply voltage and said quantity indicative of the state of said sensor circuit yield an indication of a power dissipation in the sensor circuit; and
    a combiner adapted to combine said sensor output signal with said compensation signal, thereby obtaining a compensated signal.

* * * * *